United States Patent
Kim et al.

(10) Patent No.: US 8,058,799 B2
(45) Date of Patent: Nov. 15, 2011

(54) FLAT PANEL DISPLAY APPARATUS WITH A POROUS LAYER ON A SUBSTRATE

(75) Inventors: Won-Jong Kim, Suwon-si (KR); Yong-Tak Kim, Suwon-si (KR); Jin-Baek Choi, Suwon-si (KR); Jong-Hyuk Lee, Suwon-si (KR); Yoon-Hyeung Cho, Suwon-si (KR); Min-Ho Oh, Suwon-si (KR); Byoung-Duk Lee, Suwon-si (KR); So-Young Lee, Suwon-si (KR); Sun-Young Lee, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 540 days.

(21) Appl. No.: 11/696,127

(22) Filed: Apr. 3, 2007

(65) Prior Publication Data

US 2008/0100200 A1 May 1, 2008

(30) Foreign Application Priority Data

Oct. 27, 2006 (KR) ........................ 10-2006-0105296

(51) Int. Cl.
*H05B 33/22* (2006.01)

(52) U.S. Cl. ........................................ 313/506; 313/116

(58) Field of Classification Search .................. 313/100, 313/112–113, 116, 478, 506, 512; 445/25
See application file for complete search history.

(56) References Cited

U.S. PATENT DOCUMENTS

| | | | |
|---|---|---|---|
| 2004/0150979 A1* | 8/2004 | Lambertini et al. | 362/31 |
| 2004/0227446 A1* | 11/2004 | Fujimoto et al. | 313/110 |
| 2005/0007000 A1* | 1/2005 | Chou et al. | 313/116 |
| 2005/0156520 A1* | 7/2005 | Tanaka et al. | 313/512 |
| 2005/0206310 A1* | 9/2005 | Bertram et al. | 313/506 |
| 2006/0049745 A1* | 3/2006 | Handa et al. | 313/503 |

FOREIGN PATENT DOCUMENTS

KR 2003-0004128 1/2003

OTHER PUBLICATIONS

Korean Patent Abstracts, Publication No. 1020030004128 A; dated Jan. 14, 2003 in the name of Shunpei Yamazaki.

* cited by examiner

*Primary Examiner* — Nimeshkumar Patel
*Assistant Examiner* — Mary Ellen Bowman
(74) *Attorney, Agent, or Firm* — Christie, Parker & Hale, LLP

(57) ABSTRACT

A flat panel display apparatus with reduced reflection of external light incident on the flat panel display apparatus. The flat panel display apparatus includes a substrate, a porous layer disposed on the substrate, and a plurality of display devices disposed on the substrate. Here, the porous layer is adapted to diffusedly reflect external light and/or to increase viewing angle of the flat panel display apparatus.

10 Claims, 4 Drawing Sheets

FLAT PANEL DISPLAY APPARATUS WITH A POROUS LAYER ON A SUBSTRATE

CROSS-REFERENCE TO RELATED PATENT APPLICATION

This application claims priority to and the benefit of Korean Patent Application No. 10-2006-0105296, filed on Oct. 27, 2006, in the Korean Intellectual Property Office, the entire content of which is incorporated herein by reference.

BACKGROUND OF THE INVENTION

1. Field of the Invention

The present invention relates to a flat panel display apparatus.

2. Description of the Related Art

Flat panel display apparatuses including organic light emitting apparatuses can be used alone or in combination with various apparatuses. That is, the flat panel display apparatuses can be employed in mobile equipment such as mobile phones.

When a flat panel display apparatus is employed in mobile equipment, visibility of images displayed on the mobile equipment can be reduced when outdoors due to strong outdoor light, such as sunlight. Even when indoors, the visibility of the images displayed on the flat panel display apparatus can be reduced due to strong indoor light, such as light from fluorescent lamps. Therefore, in order to prevent (or lessen) the reduction of visibility of images due to external light that is incident on the display of the flat panel apparatus, a film type polarized plate may be attached to the entire surface of a conventional flat panel display apparatus to reduce (or prevent) reflection of external light that enters into the flat panel display apparatus. As a result, brightness of reflected external light is reduced, and thus, the reduction of visibility of images due to external light is reduced (or prevented).

However, in the case of the flat panel display apparatus having the film type polarized plate, some of desired light generated from the flat panel display apparatus cannot be extracted out of the display apparatus since the film type polarized plate attached to the entire surface blocks the optical path of some of the generated light.

SUMMARY OF THE INVENTION

An aspect of an embodiment of the present invention is directed to a flat panel display apparatus that can reduce (or prevent) reflection of external light from (or in or by) the flat panel display apparatus.

According to an embodiment of the present invention, there is provided a flat panel display apparatus including: a substrate; a porous layer disposed on the substrate; and a plurality of display devices disposed on the substrate. Here, the porous layer is adapted to diffusedly reflect external light (to, e.g., reduce the intensity of the external light in a particular direction), and/or is adapted such that external light entering the flat panel display apparatus is diffusedly reflected by the porous layer. In one embodiment, the porous layer is further adapted to increase viewing angle of the flat panel display apparatus.

The display devices may be disposed on one surface of the substrate and the porous layer is disposed on another surface of the substrate.

The flat panel display apparatus may further include black matrices disposed on the another surface of the substrate to correspond to spaces between the display devices, wherein the porous layer is configured to cover the black matrices.

The display devices may be disposed on a first surface of the porous layer opposite to a second surface of the porous layer facing the substrate.

The flat panel display apparatus may further include black matrices disposed on portions of the first surface of the porous layer between the display devices.

The flat panel display apparatus may further include a buffer layer formed between the display devices and the porous layer.

The porous layer may be formed of a material having a refractive index substantially equal (or similar) to that of the substrate.

The porous layer may be a porous silicon oxide layer.

Each of the display devices may include a first electrode, a second electrode facing the first electrode, and an intermediate layer interposed between the first and second electrodes and having an emission layer.

The porous layer may be a transparent layer, the substrate may be transparent, and light generated from the display devices may be extracted out of the flat panel display apparatus through the substrate.

According to another embodiment of the present invention, there is provided a flat panel display apparatus including: a transparent substrate; a base substrate; a porous layer disposed on a surface of the transparent substrate; and a plurality of display devices disposed on a surface of the base substrate facing the transparent substrate. Here, the porous layer is between the transparent substrate and the base substrate and adapted to diffusedly reflect external light.

According to another embodiment of the present invention, there is provided a flat panel display apparatus including: a transparent substrate; a base substrate; a porous layer disposed on a first surface of the transparent substrate; and a plurality of display devices disposed on a surface of the base substrate facing a second surface of the transparent substrate. Here, the first surface of the transparent substrate is opposite to the second surface of the transparent substrate, and the porous layer is adapted to diffusedly reflect external light.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
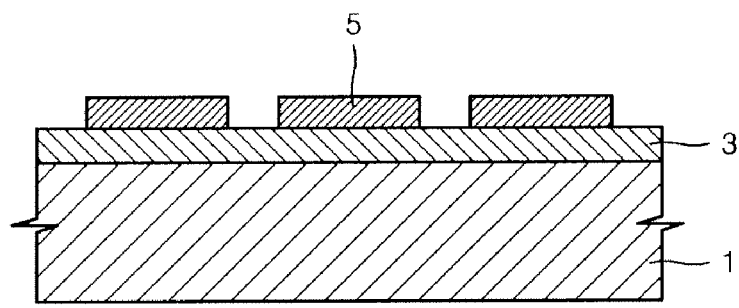
FIG. 1 is a schematic cross-sectional view illustrating a flat panel display apparatus according to an embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Also, in the drawings, the thicknesses of certain layers and regions are exaggerated for clarity, and like reference numerals refer to the like elements. Moreover, in the context of the present application, when an element is referred to as being "on" another element, it can be directly on the another element or be indirectly on the another element with one or more intervening elements interposed therebetween.

FIG. 1 is a schematic cross-sectional view illustrating a flat panel display apparatus according to an embodiment of the present invention.

Referring to FIG. 1, the flat panel display apparatus includes a substrate 1 and a porous layer 3 formed on a surface of the substrate 1. A display device (or devices) 5 is formed on a surface of the porous layer 3 opposite to the surface that faces the substrate 1.

In the above structure, light entering into the substrate 1 through the surface of the substrate 1 opposite to the surface that faces the porous layer 3 is diffusedly reflected by the porous layer 3 so that the light cannot be reflected back out of the flat panel display apparatus through the surface of the substrate 1 opposite to the surface that faces the porous layer 3. That is, although external light enters into the substrate 1, the light is diffusedly reflected by the porous layer 3 so as to not be reflected back out of the flat panel display apparatus. When the external light is diffusedly reflected, the intensity of the external light in a particular direction, for example, to a viewer, is reduced. In this way, when the reflection of external light in a particular direction is greatly reduced, the visibility of an image displayed on the flat panel display apparatus is greatly increased. Also, light generated from the display device 5 can be diffusedly transmitted while passing through the porous layer 3. The diffuse transmission of the light generated from the display device 5 provides the effect of increasing the viewing angle of the flat panel display apparatus. As a result, the flat panel display apparatus according to the present embodiment can increase visibility of an image displayed by the display devices 5 by reducing external light reflection and also increases viewing angle.

When the porous layer 3 described above is interposed between the substrate 1 and the display devices 5, light generated from the display devices 5 is extracted out of the flat panel display apparatus through the porous layer 3 and the substrate 1. Accordingly, in one embodiment, the porous layer 3 has a characteristic (and/or a property) that can reduce or prevent the light generated from the display devices 5 from being reflected at an interface between the porous layer 3 and the substrate 1. For this purpose, the porous layer 3 can be formed to have a refractive index similar (or substantially equal) to that of the substrate 1. When the substrate 1 is formed of glass, the refractive index is about 1.5. Therefore, the porous layer 3 may be formed of a material having a refractive index ranging from about 1.43 to about 1.55, such as silicon oxide.

The porous layer 3 can be formed by various suitable methods using various suitable materials. Some of the examples are detailed as follows.

A porous silicon oxide layer having a pore size (or average pore size) ranging from about 3 to about 50 nm can be formed of a surfactant (or a block copolymer) and a silica precursor using a template method. The silica precursor can be tetraethoxysilane (TEOS), silica, alumina, and/or zirconia. More specifically, a mixed aqueous solution of a surfactant such as cetyltrimethylammonium bromide (CTAB) and/or cetyltrimethylammonium chloride (CTAC), and a silica precursor such as TEOS and/or vinyltrimethoxysilane (VTMOS) can be formed. After adding hydrochloric acid as a catalyst to the mixed aqueous solution, the mixed aqueous solution is spin coated on the substrate 1. For example, a mixed aqueous solution is manufactured by mixing 10.24 g of CTAC, 1.46 g of CTAB, 8.4 g of TEOS, 2.08 g of VTMOS, and 21.18 g of water, and subsequently adding about seven drops of hydrochloric acid as a catalyst. After the mixed aqueous solution is spin coated on the substrate 1, the resultant product is dried at 180° C. for 24 hours, and fired at 500° C. for 8 hours. As a result, a porous silica film having a thickness ranging from 100 to 560 nm, a porosity of 30%, and a pore size (or average pore size) ranging from 2 to 5 nm can be manufactured. Beside the above mentioned method, the porous silicon oxide layer according to the present invention can be manufactured in various suitable ways. That is, the porous silicon oxide layer can also be formed by firing a coated silica sol (e.g., colloidal silica or silica sol-gel) after spin coating the silica sol on the substrate 1.

Figure 2:
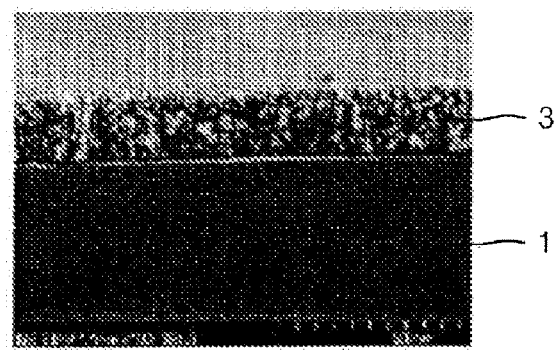
FIG. 2 is an photograph image showing a cross-section of a substrate and a porous layer of the flat panel display apparatus of FIG. 1 according to an embodiment of the present invention.

FIG. 2 is a photograph image showing a cross-section of the substrate 1 and the porous layer 3 of FIG. 1, according to an embodiment of the present invention.

As described above, the visibility of an image displayed by the display devices 5 can be greatly increased by forming the porous layer 3 on the substrate 1 to diffusedly reflect external light that enters into the flat panel display apparatus through the substrate 1.

Figure 3:
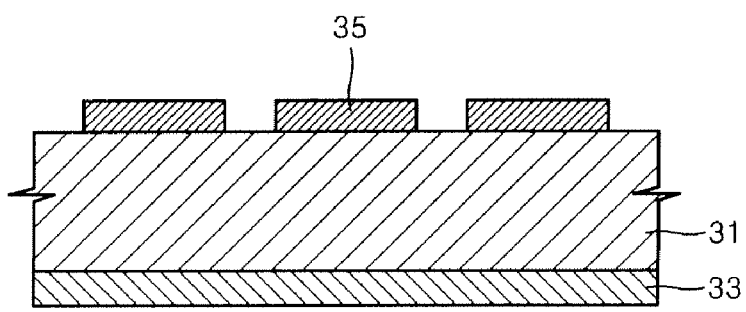
FIG. 3 is a schematic cross-sectional view illustrating a flat panel display apparatus according to another embodiment of the present invention.

In FIG. 1, both the porous layer 3 and the display devices 5 are formed on one side of the substrate 1. However, another embodiment of the present invention envisions a different structure from FIG. 1. That is, as depicted in FIG. 3, which is a schematic cross-sectional view illustrating a flat panel display apparatus according to the another embodiment of the present invention, a porous layer 33 can be formed on one surface of a substrate 31 and display devices 35 can be formed on another surface of the substrate 31. Since the porous layer 33 is manufactured substantially as per the above described method for the embodiment of FIG. 1, the porous layer 33 has pores having a size (or average size) of a few nanometers. Therefore, although the porous layer 33 is disposed on an external side of the flat panel display apparatus, viewers cannot detect (or feel) any roughness. When external light is diffusedly reflected by the porous layer 3 after passing through the substrate 1 (for example in the embodiment of FIG. 1), some of the external light can be reflected by the substrate 1 prior to reaching the porous layer 3. In such a case, the external light reflected by the substrate 1 can reduce the visibility of an image displayed on the flat panel display apparatus. Therefore, as depicted in FIG. 3, the porous layer 33 is disposed on a surface of the substrate 31 through which external light enters so that the external light can be diffusedly reflected by the porous layer 33 prior to reaching the substrate 31, thereby further effectively reducing (or preventing) the reduction of visibility due to reflection of external light.

Figure 4:
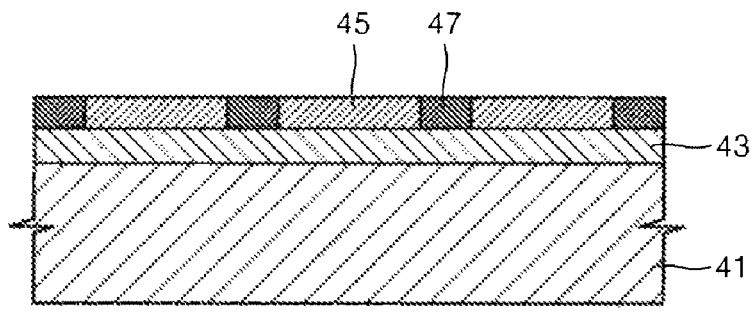
FIG. 4 is a schematic cross-sectional view illustrating a flat panel display apparatus according to another embodiment of the present invention.

FIG. 4 is a schematic cross-sectional view illustrating a flat panel display apparatus according to another embodiment of the present invention.

A difference between the flat panel display apparatus of FIG. 1 and the flat panel display apparatus of FIG. 4 is that the panel display apparatus of FIG. 4 further includes black matrices 47 formed between display devices 45. That is, a porous layer 43 is formed on a surface of a substrate 41, and the display devices 45 are disposed on a surface of the porous layer 43 opposite to the surface facing the substrate 41. The black matrices 47 are disposed between the display devices 45.

The black matrices 47 can further increase contrast of images displayed by the display devices 45. That is, as depicted in FIG. 4, the flat panel display apparatus according to the present embodiment has a structure in which the porous layer 43 is interposed between the substrate 41 and the black matrices 47. Accordingly, the surfaces of the black matrices 47 that face the substrate 41 have effects of being treated to have an increased roughness. Thus, an effect of reducing reflection of external light at portions where the black matrices 47 are disposed can be obtained. As a result, contrast and visibility of images displayed on the flat panel display apparatus can be further (or greatly) increased.

Figure 5:
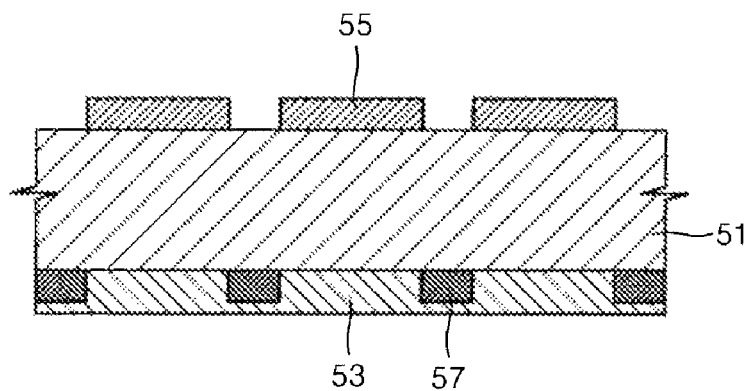
FIG. 5 is a schematic cross-sectional view illustrating a flat panel display apparatus according to another embodiment of the present invention.

FIG. 5 is a schematic cross-sectional view illustrating a flat panel display apparatus according to another embodiment of the present invention.

A difference between the flat panel display apparatus of FIG. 3 and the flat panel display apparatus of FIG. 5 is that the panel display apparatus of FIG. 5 further includes black matrices 57 formed in a porous layer 53. That is, in the flat panel display apparatus according to the present embodiment, the porous layer 53 is formed on a surface of the substrate 51, and display devices 55 are disposed on the other surface of the substrate 51, and the black matrices 57 are formed on one surface of the substrate 51 to correspond to spaces between the display devices 55. In one embodiment, the porous layer 53 is formed to cover the black matrices 57 and/or the porous layer 53 is thicker than the black matrices 57.

In the structure shown in FIG. 5, external light that enters the flat panel display apparatus through the surface of the substrate 51 on which the porous layer 53 and the black matrices 57 are formed can be diffusedly reflected prior to reaching the substrate 51 by the porous layer 53, and accordingly, contrast of images displayed by the display devices 55 can further be increased by the black matrices 57. Also, since the porous layer 53 covers the black matrices 57, the effect of increasing surface roughness of the surface of the black matrices 57 that face the porous layer 53 can be obtained.

Figure 6:
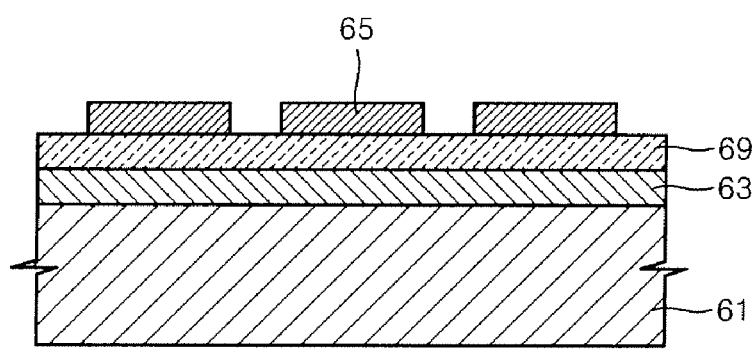
FIG. 6 is a schematic cross-sectional view illustrating a flat panel display apparatus according to another embodiment of the present invention.

FIG. 6 is a schematic cross-sectional view illustrating a flat panel display apparatus according to another embodiment of the present invention. A difference between the flat panel display apparatus of FIG. 1 and the flat panel display apparatus of FIG. 6 is that the panel display apparatus of FIG. 6 further includes a buffer layer 69 between a porous layer 63 and display devices 65 thereof. The porous layer 63 may have a relatively high surface roughness. Accordingly, when elements that constitute the display devices 65 such as electrodes are formed on the porous layer 63, the formation of the elements may fail due to the relatively high roughness of the porous layer 63. To prevent this possible failure, as depicted in FIG. 6, the buffer layer 69 is formed on the porous layer 63 and the display devices 65 can be formed on the buffer layer 69, if necessary. The buffer layer 69 can be formed of a material such as silicon oxide and/or silicon nitride.

Figure 7:
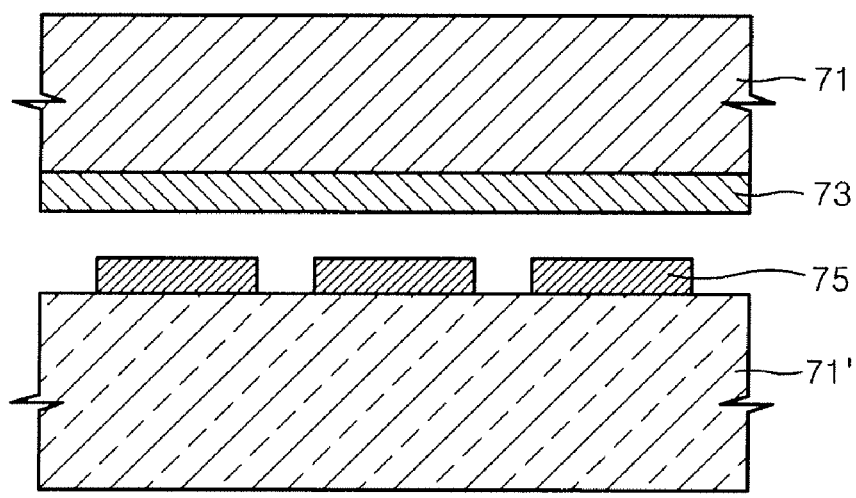
FIG. 7 is a schematic cross-sectional view illustrating a flat panel display apparatus according to another embodiment of the present invention.
Figure 8:
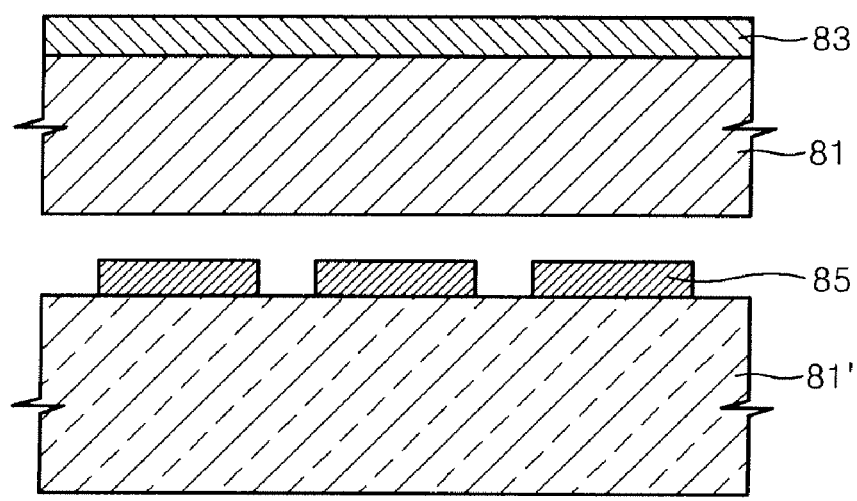
FIG. 8 is a schematic cross-sectional view illustrating a flat panel display apparatus according to another embodiment of the present invention.

In FIGS. 1 through 6, bottom emission type flat panel display apparatuses in which the display devices (e.g., the display devices 5) are formed on the substrate (e.g., the substrate 1) and light generated from the display devices is extracted to the outside through the substrate are described, but the present invention is not limited thereto. That is, as depicted in FIG. 7, an embodiment of the present invention can also be applied to a top emission type flat panel display apparatus in which a base substrate 71' is further included. Here, in FIG. 7, a porous layer 73 is disposed on a surface of a substrate (or a transparent substrate) 71 facing the base substrate 71', and display devices 75 are disposed on a surface of the base substrate 71' facing the substrate 71. In such an arrangement, light generated from the display devices 75 is extracted out of the flat panel display apparatus not though the base substrate 71' but through the substrate 71. Also, another structure of a top emission type flat panel display apparatus according to another embodiment of the present invention is depicted in FIG. 8. Here, similar to the embodiment of FIG. 7, a base substrate 81' is further included; however, the base substrate 81' is disposed to face a surface of a substrate (or a transparent substrate) 81 opposite to another surface of the substrate 81 on which a porous layer 83 is formed. Thus, the porous layer 83 is disposed on an outer surface of the display panel having the substrate 81 and the base substrate 81', and the display devices 85 are disposed on a surface of the base substrate 81' facing the substrate 81. The black matrices (e.g., the black matrices 47 and/or 57) described in FIGS. 4 and 5 can also be applied to the top emission type flat panel display apparatuses of FIGS. 7 and 8.

In view of the foregoing, display devices included in flat panel display apparatuses according to certain embodiments of the present invention can be various suitable types of display devices.

Figure 9:
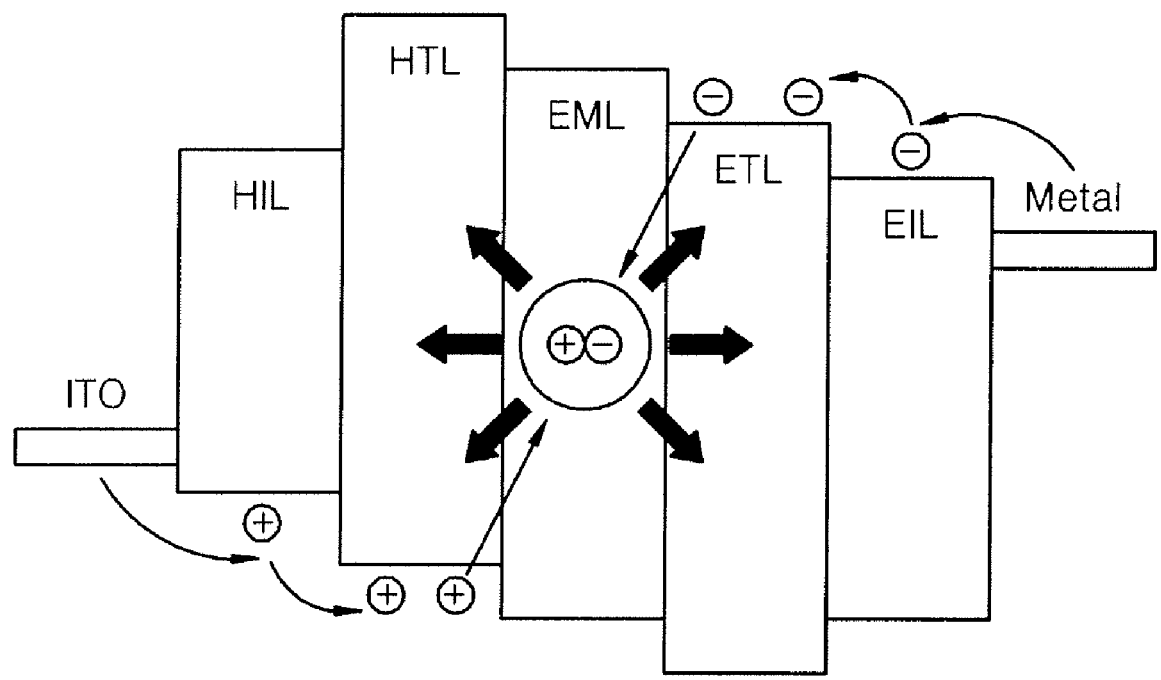
FIG. 9 is a schematic view illustrating an organic light emitting device including a first electrode, a second electrode, and intermediate layer interposed between the first and second electrodes according to an embodiment of the present invention.

In particular, if the display devices are organic light emitting devices, an enhancement effect of certain embodiments of the present invention are further enhanced. Referring to FIG. 9, in one embodiment, each of a plurality of organic light emitting devices includes a first electrode (e.g., ITO), a second electrode (e.g., metal) facing the first electrode, and an intermediate layer that_is interposed between the first and second electrodes and includes a hole injection layer (HIL), a hole transport layer (HTL), a light emitting layer (e.g., EML), an electron transport layer (ETL) and an electron injection layer (EIL). The first electrodes of the plurality of organic light emitting devices are patterned to be separated from each other and are electrically connected to corresponding thin film transistors (that may be disposed between a substrate and the organic light emitting devices). The second electrodes are formed in one unit (or as one continuous body) in the plurality of organic light emitting devices. Here, the second electrodes of the plurality of organic light emitting devices are formed in the one unit to correspond to an entire surface of a display unit of a substrate. Accordingly, external light that enters from the outside of the substrate is reflected by the second electrodes of the organic light emitting devices formed in the one unit on the entire surface of the substrate; thus, the visibility of images displayed by the organic light emitting devices may be reduced. Therefore, when the porous layer or the porous layer and the black matrices having various structures according to the embodiments of the present invention are included in organic light emitting display apparatuses that include organic light emitting devices as display devices, the visibility of images displayed by the organic light emitting devices can be further enhanced (or greatly increased).

As described above, according to certain embodiments of the present invention, a flat panel display apparatus that can greatly increase the visibility of images displayed by display devices can be realized by using a porous layer to reduce (or prevent reflection) of external light by the flat panel display apparatus.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A flat panel display apparatus comprising:
a substrate;
a porous layer on a first surface of the substrate;
a plurality of display devices on a second surface opposite the first surface of the substrate; and
a plurality of black matrices on the first surface of the substrate to correspond to spaces between the display devices, the porous layer covering the black matrices, both the porous layer and the black matrices contacting the first surface,
wherein the porous layer is adapted to diffusedly reflect external light, and
wherein the porous layer comprises a material having a refractive index between about 1.43 and about 1.55.

2. The flat panel display apparatus of claim 1, wherein the porous layer is thicker than the black matrices.

3. The flat panel display apparatus of claim 1, wherein the porous layer is formed of a material having a refractive index substantially equal to that of the substrate.

4. The flat panel display apparatus of claim 1, wherein the porous layer comprises silicon oxide, and wherein the substrate comprises glass.

5. The flat panel display apparatus of claim 4, wherein the substrate comprises a material having a refractive index of about 1.5.

6. The flat panel display apparatus of claim 1, wherein the porous layer is a porous silicon oxide layer.

7. The flat panel display apparatus of claim 1, wherein each of the display devices comprises a first electrode, a second electrode facing the first electrode, and an intermediate layer interposed between the first and second electrodes and having an emission layer.

8. The flat panel display apparatus of claim 1, wherein the porous layer is a transparent layer, the substrate is transparent, and light generated from the display devices is extracted out of the flat panel display apparatus through the substrate.

9. The flat panel display apparatus of claim 1, wherein the porous layer has a thickness between about 100 and about 560 nm and an average pore size between about 2 and about 5 nm, and wherein the porous layer is further adapted to increase a viewing angle of the flat panel apparatus.

10. A flat panel display apparatus comprising:
a substrate;
a porous layer on a first surface of the substrate;
a plurality of display devices on a second surface opposite the first surface of the substrate; and
a plurality of black matrices on the first surface of the substrate in spaces defined between the display devices, the porous layer covering the black matrices, both the porous layer and the black matrices contacting the first surface,
wherein the porous layer is formed of a material having a refractive index substantially equal to that of the substrate.

* * * * *